(12) United States Patent
Koh et al.

(10) Patent No.: US 6,842,031 B2
(45) Date of Patent: Jan. 11, 2005

(54) METHOD OF ELECTRICALLY TESTING SEMICONDUCTOR DEVICES

(75) Inventors: Gil-Young Koh, Chungcheongnam-do (KR); Jeong-Ho Bang, Kyungki-do (KR); Jong-Bok Tcho, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 40 days.

(21) Appl. No.: 10/361,156

(22) Filed: Feb. 7, 2003

(65) Prior Publication Data
US 2003/0184335 A1 Oct. 2, 2003

(30) Foreign Application Priority Data
Feb. 8, 2002 (KR) .......................................... 2002-7531

(51) Int. Cl.[7] .............................................. G01R 31/00
(52) U.S. Cl. ..................... 324/765; 324/158.1
(58) Field of Search ...................... 324/158.1, 763–765; 714/718–720, 733; 365/200–201; 438/14–18

(56) References Cited

U.S. PATENT DOCUMENTS

| 5,225,775 A | * | 7/1993 | Sekino ..................... 324/158.1 |
| 6,360,340 B1 | * | 3/2002 | Brown et al. ................ 714/718 |
| 6,545,497 B2 | * | 4/2003 | Hebert et al. ................ 324/765 |

* cited by examiner

Primary Examiner—Vinh P. Nguyen
(74) Attorney, Agent, or Firm—Marger Johnson & McCollom PC

(57) ABSTRACT

A method of electrically testing a semiconductor device preferably includes connecting a common input/output signal channel (line) of a socket board to two or more data pins of the semiconductor device. Signals output from the semiconductor device may be sequentially read via the short-circuited input/output signal lines of the socket board by carrying out a byte operation function. The throughput of a semiconductor test system can thereby be increased by increasing the number of devices that can be tested in parallel.

15 Claims, 6 Drawing Sheets

METHOD OF ELECTRICALLY TESTING SEMICONDUCTOR DEVICES

This application claims priority from Korean Patent Application No. 2002-0007531, filed on Feb. 8, 2002, the contents of which are incorporated herein by reference in their entirety.

BACKGROUND OF THE INVENTION

The present invention relates to semiconductor devices, and more particularly, to a method of electrically testing a semiconductor memory device.

Semiconductor devices are produced in a wafer state, assembled as semiconductor packages, and electrically tested before being delivered to users. Because semiconductor memory devices have recently become high capacity, high speed, multi-pin devices (such as DRAMs), the efficiency of their electrical test processes must be increased. To increase the efficiency of the electrical test processes, testers focus on higher velocities and improvement of throughput time. Throughput time can be improved in various ways. One way to improve throughput time is by controlling a test program. Another way to increase throughput rate and improve throughput time is to increase the number of semiconductor memory devices that can be tested simultaneously, i.e., by testing an increased number of devices in parallel.

FIG. 1 is a block diagram of a conventional tester 100 for testing a semiconductor memory device 300. A tester 100 can be used to detect defects that occur in a wafer fabricating process or in an assembling process and can thereby screen-out good products. Referring to FIG. 1, a tester 100 may interface with a device under test (DUT) 300 by way of an interface board 200 having a socket for seating the DUT 300. A handler (not shown) may be used to load the DUT 300 into the socket of the interface board 200 (also referred to as a "socket board").

Tester 100 has a test processor 110 for controlling hardware components within the tester 100. The hardware components may include, for example, a programmable power supply 112, a direct current (DC) parameter measurement unit 114, an algorithmic pattern generator 116, a timing generator 118, a wave shape formatter 120, and pin electronics 150. The pin electronics 150 can include a driver signal channel (not shown), and an input/output (I/O) signal channel (not shown). The pin electronics 150 may also include a comparator. The tester 100 operates test programs of the test processor 110 to cause the hardware components to exchange signals with each other to test electrical functions of the DUT 300 via the pin electronics 150 and the socket board 200.

The test programs can include a DC test program, an alternating current (AC) test program, and a functional test program. The functional test program may ascertain the function of a semiconductor memory device (e.g., a DRAM) during actual operation. In other words, the tester 100 may write an input pattern of the algorithmic pattern generator 116 into the DRAM being tested (DUT 300). The tester may then read the pattern from the DRAM and compare the pattern read with that of an expected pattern using the comparator.

FIG. 2 is a block diagram illustrating certain characteristics of a driver channel and an input/output (I/O) channel. Driver and I/O channels may be disposed in the pin electronics 150 of the tester 100 shown in FIG. 1. Referring to FIG. 2, the maximum number of DUTs 300 that can be tested in parallel in the tester 100 is limited by the number of channels of the pin electronics 150. The channel of pin electronics 150 may comprise a driver signal channel 152 and I/O signal channel 154.

The driver channel 152 may fan-out to drive multiple pins of the DUT 300 in the socket board 200. Fanning out to multiple pins may enable an increase in the number of DUTs 300 that can be driven in parallel within the electrical test process. In this manner, one driver channel 152 can control two or more address pins or control pins of the DUT 300.

The I/O signal channel 154 can read data from the DUT 300. The data may be kept unique to enable pattern comparisons with an expected pattern in tester 100. Thus, unlike the driver signal channel 152, the I/O signal channel 154 cannot share I/O data pins DQ of the DUT 300 in the socket board. In other words, conventionally, an I/O signal channel 154 can only be connected to one data pin DQ of the DUT 300 at a time. The maximum number of DUTs that can be tested in parallel within a conventional tester 100 is therefore related both to the number of I/O signal channels of the pin electronics 150 of the tester 100 and to the number of data pins of the DUT 300. For this reason, the number of I/O signal channels 154 in the pin electronics 150 of the tester 100 and the pin count of the DUT 300 determines the maximum number of DUTs that may be tested in parallel in the tester 100. For example, twice as many eight-pin DUTs as sixteen-pin DUTs can be tested in parallel in the conventional tester 100.

FIG. 3 is a flowchart illustrating a conventional method 305 of testing semiconductor memory devices. Referring to FIGS. 1–3, a socket board 200 is conventionally configured to establish connections for data pins of a DUT 300 in one-to-one relationship with I/O signal channels of the pin electronics 150 of a tester 100 (block 310). An electrical test begins (block 320) after the socket board 200 has been configured to interface and connect the tester 100 to the DUT 300. The tester 100 then reads (block 330) data output from the data pins of the DUT 300 one-at-a-time during functional test operations of the DUT 300 via I/O signal lines of the socket board 200.

This method of operation allows unique data to be read and compared individually with the expected pattern in the tester. For example, sixteen data pins of a DUT can permit testing of two separate eight-bit units. Sixteen data bits may be read together and compared with an expected two-byte pattern in the tester. Thus, increasing the number of data pins DQ of a DUT (e.g., from eight to sixteen data pins) may result in a decrease in device throughput rate in an electrical test process in a conventional tester 100, because of the limiting one-to-one relationship between data pins and respective I/O signal channels.

SUMMARY OF THE INVENTION

According to one embodiment of the present invention, a method of testing a DUT improves the number of DUTs that can be tested in parallel by diverging, or fanning-out, an I/O signal channel and by using a byte operation function of the DUTs.

In one embodiment, a method of testing a semiconductor device comprises shorting input/output signal lines so that two or more data pins are connected to one input/output signal channel in a socket board. During an electrical test of the semiconductor device, signals output from the semiconductor device are sequentially read byte-by-byte via the short-circuited input/output signal lines using a byte operation function.

According to another embodiment, the semiconductor device includes a DRAM device that can perform a byte operation function. The byte operation function is preferably used to first activate one of the upper and lower data input/output mask pins of the DRAM and then the other. The signals output from the semiconductor device can be asynchronously read as output using the byte operation function.

In yet another embodiment, the input/output signal lines are short-circuited so that two or more data pins are connected to one input/output signal channel in a socket board. The upper byte portions of the input/output signal lines are connected one-to-one to corresponding lower byte portions of the input/output signal lines. The number of upper and lower byte input/output signal lines may be four, eight, or sixteen, for example.

In a further embodiment, the upper and lower byte data may be unique, and write operations may be performed in the semiconductor device before read operations. The write operations may be performed without use of the upper and lower data input/output mask pins. If the upper and lower byte data are not unique, the write operations may be performed using the upper and lower data input/output mask pins.

According to a still further embodiment, sequential reading may comprise activating the lower byte data input/output mask pin and reading upper byte output signals of the semiconductor device. Next, the upper byte data input/output mask pin can be activated and the lower byte output signals can be read from the semiconductor device. Alternatively, the lower byte output signals from the semiconductor device can be read first, followed by the upper byte output signals. In one particular embodiment, a predetermined delay is provided before reading the upper byte signals and the lower byte signals.

Various embodiments of the present invention therefore provide improved throughput by increasing the number of DUTs that can be tested in parallel in a tester. In addition, DUTs having eight data pins can be tested using the same socket board as used for testing DUTs having sixteen data pins. The time that might otherwise be required for replacing the socket board can therefore be saved. Furthermore, a general calibration procedure for the propagation delay time of a replacement socket board can be avoided. An increase in the operation efficiency of the tester can thereby be achieved. Improvement in the throughput time can also reduce the number of testers required for a given manufacturing flow, in turn allowing for a reduction in facility investment costs.

BRIEF DESCRIPTION OF THE DRAWINGS

The foregoing and other features and benefits of the present invention will become more readily apparent through the following detailed description, made with reference to the accompanying drawings, in which.

DETAILED DESCRIPTION OF PREFERRED EMBODIMENTS

Various embodiments of the present invention will now be described with reference to the accompanying drawings. It should be understood, however, that the embodiments of the present invention described herein can be modified in form and detail without departing from the spirit and scope of the invention. Accordingly, the specific embodiments described herein are provided by way of example and not of limitation, and the scope of the present invention is not restricted to the particular embodiments described herein.

For example, according to various embodiments of the present invention, the total number of data pins of a DUT can be sixteen. In alternative embodiments, however, the DUT may comprise eight pins, thirty-two pins, or any other appropriate number of pins. In addition, in the following preferred embodiments, only two data pins are short-circuited. It should be understood, however, that other embodiments can employ socket boards in which four or more data pins are short-circuited. Accordingly, the described embodiments are exemplary only and are not to be interpreted as restrictive of the scope of the invention.

Figure 1:
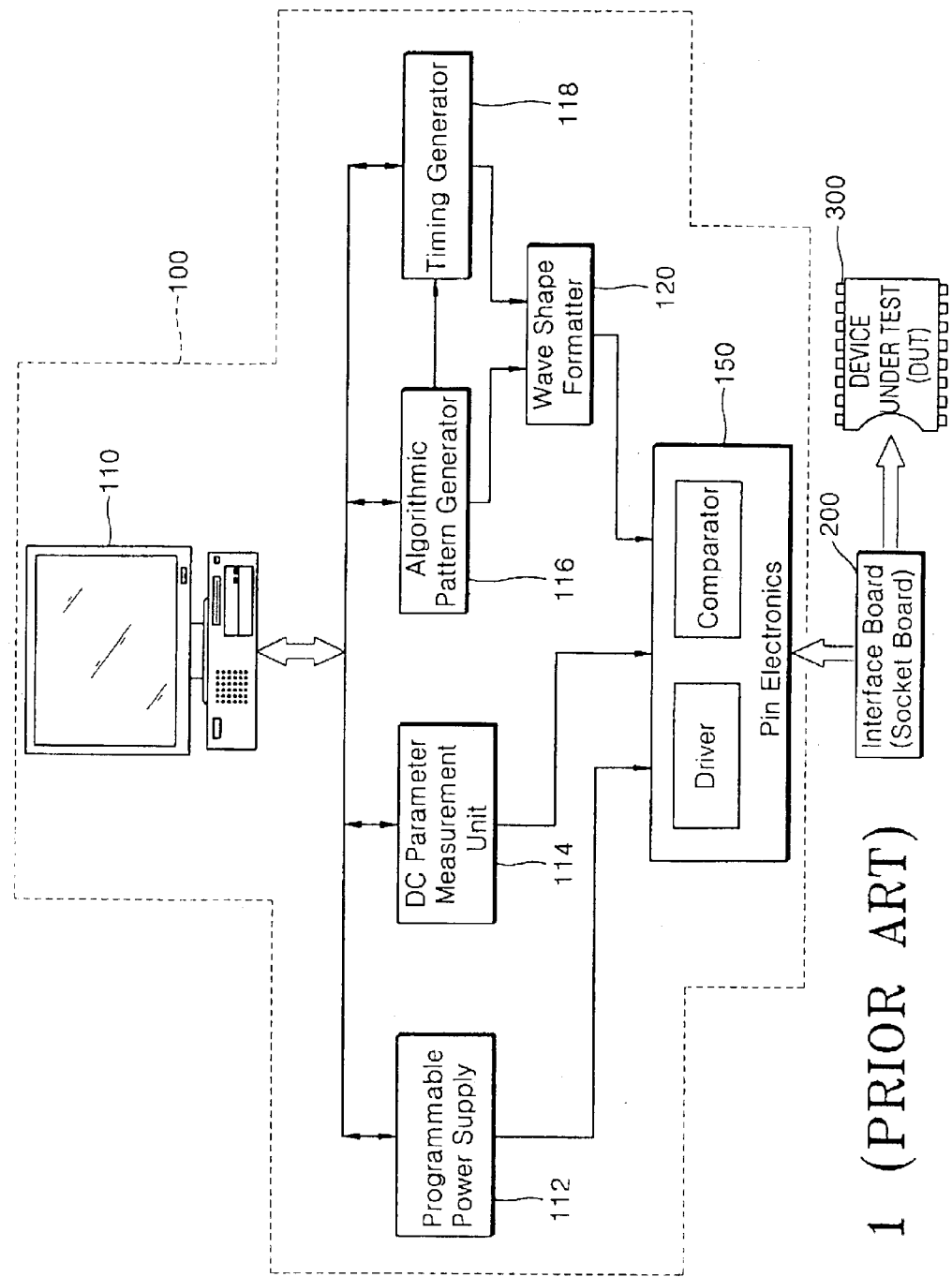
FIG. 1 is a block diagram of a conventional tester for a semiconductor memory device.
Figure 2:
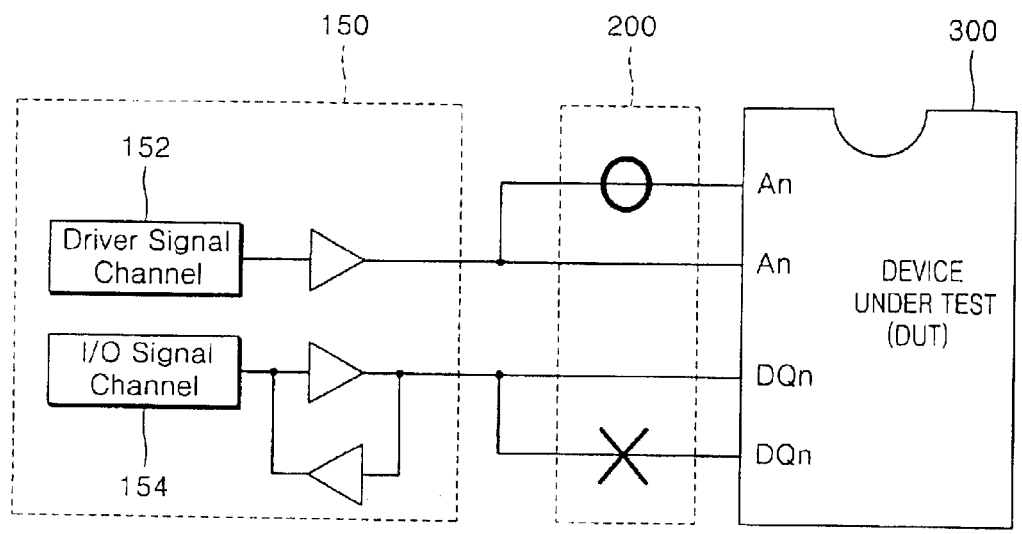
FIG. 2 is a block diagram illustrating a driver signal channel and an I/O signal channel of pin electronics of the tester of FIG. 1.
Figure 3:
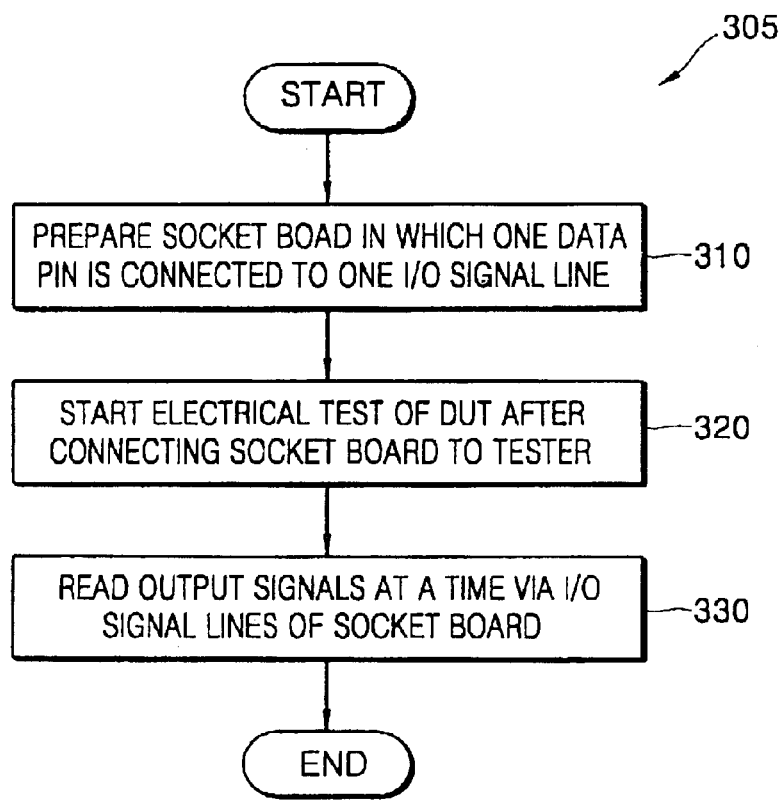
FIG. 3 is a simplified flowchart illustrating a conventional method of testing a semiconductor memory device using the tester of FIGS. 1 and 2.
Figure 4:
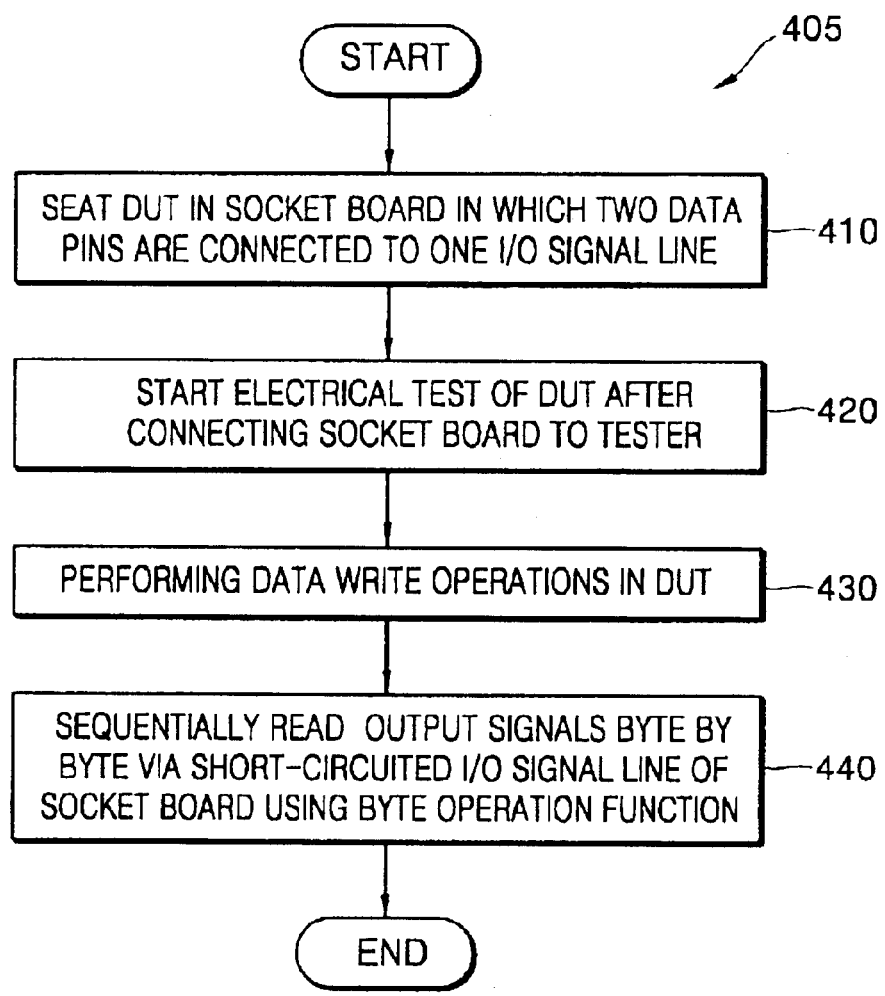
FIG. 4 is a simplified flowchart illustrating a method of testing a semiconductor memory device according to an embodiment of the present invention.
Figure 5:
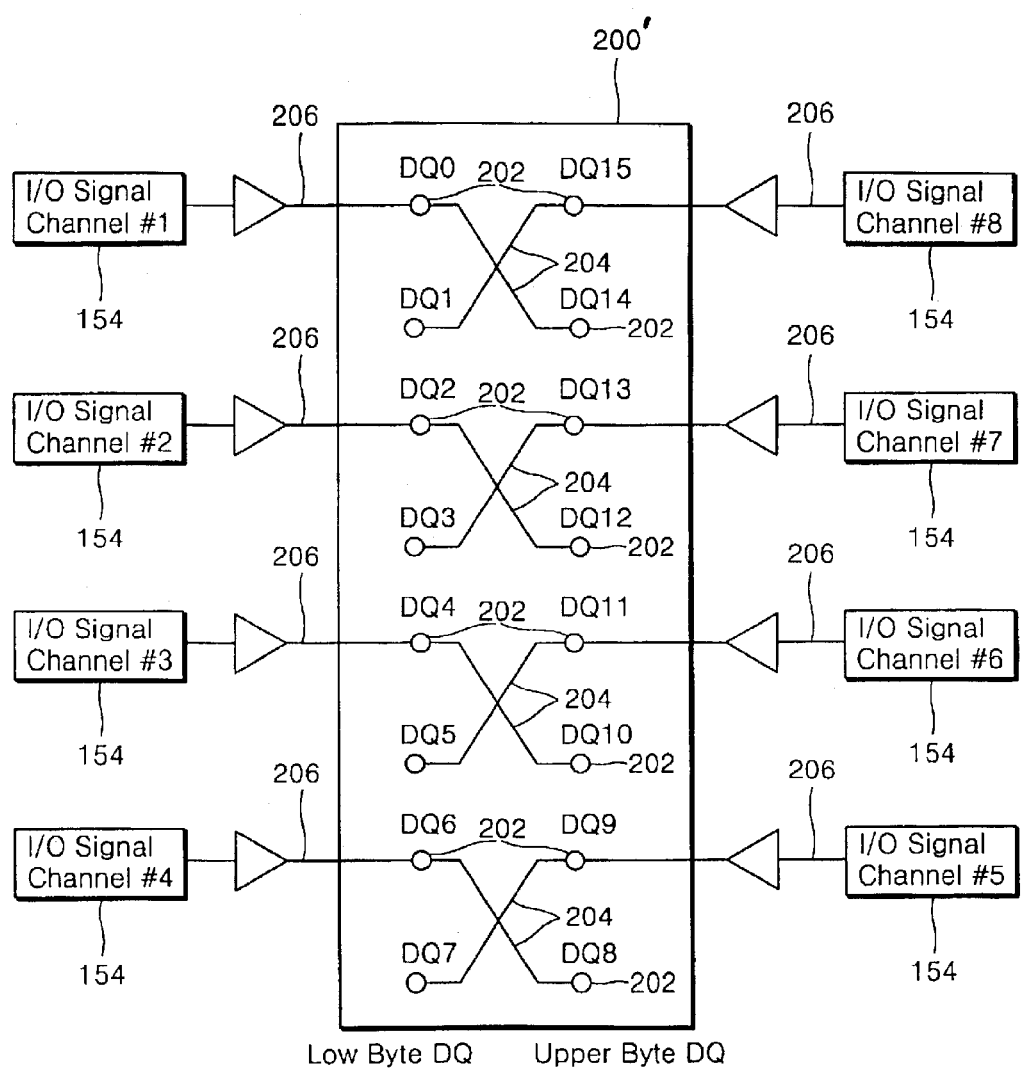
FIG. 5 is a simplified block diagram of a socket board comprising short-circuit interconnects permitting one I/O signal channel to be connected to two data pins in the socket board according to another aspect of the present invention.
Figure 6:
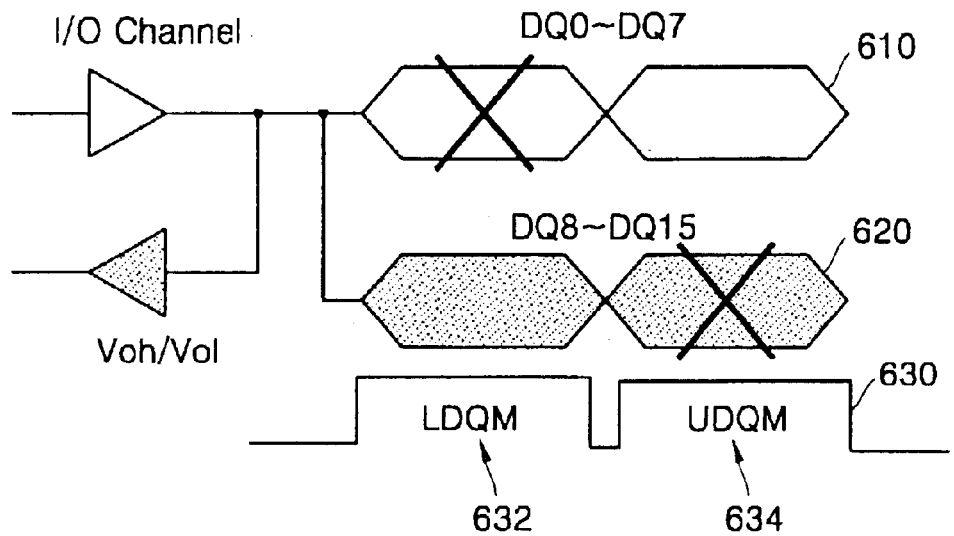
FIGS. 6 and 7 are timing diagrams of a byte operation function in which a socket board having short-circuit interconnects connects one I/O signal channel to two data pins.
Figure 7:
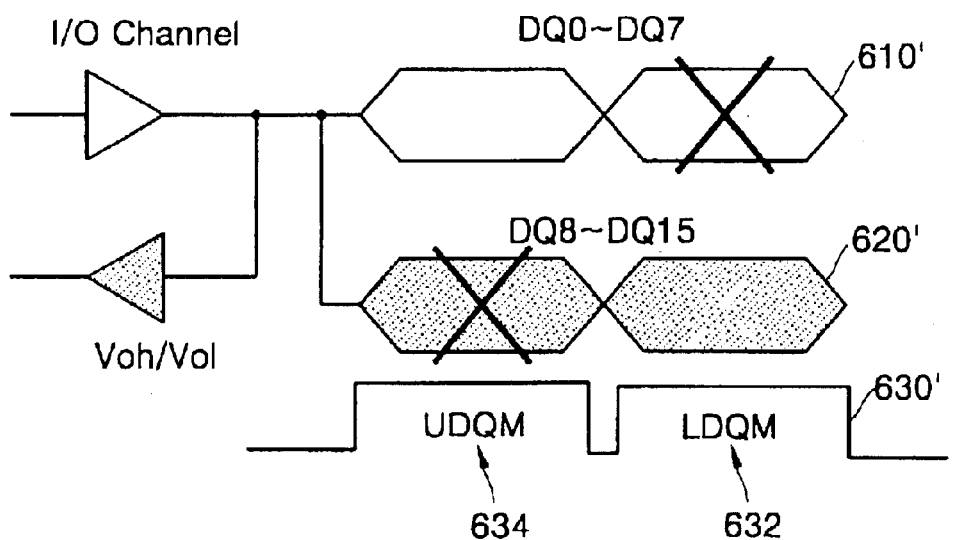

FIG. 4 is a flowchart illustrating a method 405 for testing a semiconductor memory device according to an embodiment of the present invention. FIG. 5 is a simplified block diagram of a socket board 200' comprising short-circuited interconnects operable to allow one I/O signal channel 154 to drive two data pins DQ in the socket board 200'. FIGS. 6 and 7 are timing diagrams illustrating a byte operation function for a socket board, such as socket board 200' of FIG. 5, providing short-circuited interconnects connecting one I/O signal channel to two data pins.

Referring to FIGS. 4–7, in a method 405 of testing a semiconductor memory device according to an embodiment of the present invention, a socket board 200 provides an interface between a tester and a DUT. Connection lines 204 connect upper byte signal parts 202 to lower byte signal parts 202 in a one-to-one relationship.

Each of the upper and lower byte signal parts 202 contact a respective data pin DQ of a DUT. Signal lines 206 connect I/O signal channels 154 to respective pin electronics of a tester. Here, one I/O signal channel in the pin electronics of the tester is connected (block 410) to two data pins DQ of the DUT via the signal lines 206.

In one particular embodiment, the DUT is a DRAM and the total number of data pins DQ of the DUT is sixteen. Alternative embodiments, however, may comprise other numbers of data pins (e.g., eight or thirty-two data pins). Accordingly, if the total number of data pins DQ of the DUT in the socket board is eight, the eight pins may be divided into two groups of four pins each. If the total number of data pins DQ of the DUT in the socket board is thirty-two, then the thirty-two pins can be divided into two groups of sixteen pins each. In the present embodiment, the sixteen data pins DQ are divided into two groups of eight pins each.

The DUT may be connected (block 405) to the tester using a socket board having connection lines 204 before beginning an electrical test (block 420). The DUT can, for example, comprise a DRAM device such as a SAMSUNG ELECTRONICS K4S641632F CMOS SDRAM device. The DUT may be operable to mask output data pins DQ into byte-unit partitions. In other words, if the total number of data pins DQ of the DUT is sixteen, separate byte units of each byte (eight bits) may be selectively configurable for high output impedance (Hi-Z or tri-state) so that their output signals may be blocked depending on the condition of the mask control signals that determine the masking functions.

Control pins to carry the mask control signals can, for example, comprise an upper byte data I/O mask pin UDQM and a lower byte data I/O mask pin LDQM. In other words, if the upper byte data I/O pin UDQM is activated when the tester asynchronously reads data from the DUT (block 440), upper byte output signals DQ8 through DQ15 of the sixteen data outputs may assume a Hi-Z state. In contrast, if the lower byte data I/O pin UDQM is activated when the tester asynchronously reads data from the DUT, lower byte output signals DQ0 through DQ7 of the sixteen data outputs may assume a Hi-Z state. This type of operation is referred to herein as a "byte operation function".

A DC test may be performed using a general method in the electrical test process. Data may be written (block 430) in each cell of the DUT using a functional test process. In a particular embodiment, the write data may all be the same values and the write operations may be performed at the same time for all data pins via the eight short-circuited I/O signal lines of the socket board. In this embodiment, the I/O signal channels in the pin electronics of the tester may drive multiple pins simultaneously to input signals to the DUT. In an alternative method of operation, if the write data should comprise different values, the data write operations may be performed in sequential byte operations and the separate bytes may be input via the upper or lower byte data I/O mask pin UDQM or LDQM, respectively.

Referring specifically to FIG. 6, when reading data, the lower byte data I/O mask pin LDQM may be activated (e.g., in an ON state when positive) to produce a signal 630 having a first duration 632. The upper byte signals 620 (DQ8 through DQ15) of the sixteen possible signals may then be asynchronously read. During this upper byte read, outputs of the lower byte signals 610 (DQ0 through DQ7) may be blocked.

Next, the lower byte data I/O mask pin LDQM may be deactivated during a second duration 634 of signal 630, and the upper byte data I/O mask pin UDQM may be activated to allow output and reading of the lower byte signals 610 (DQ0 through DQ7) from among the available sixteen output signals. In other words, unlike in the conventional electrical test method, all sixteen output signals are not read at the same time. Instead, two separate bytes (eight bits each) of the sixteen output signals may be sequentially read by carrying out the byte operation function of the semiconductor device using respective activations of the lower and upper byte data I/O mask pins LDQM and UDQM, respectively.

Referring now to FIG. 7, in an alternative data reading sequence, the upper byte data I/O mask pin UDQM is first activated (block 634) (ON when positive) and the lower byte output signals 610' (DQ0 through DQ7) are read. The lower byte data I/O mask pin LDQM is then activated (block 632) and the upper byte output signals 620' (DQ8 through DQ15) are then read. In this embodiment, to obtain the time required for stable data output, some delay can be provided before and between separate byte reads.

According to the foregoing exemplary embodiments of the present invention, the socket board may be configured to allow one I/O signal channel to interface two or more data pins. In various alternative embodiments, electrical shorts can be established between the pins. Additionally, the signals that may be output from a DUT may be read in separate byte portions by carrying out a byte operation function and using upper/lower byte data I/O mask pins of the DUT. According to various principles of the present invention, therefore, the number of DUTs that can be tested in parallel can be increased (e.g., by double or more).

Also, the socket board used to short the short-circuited I/O signal channel can be used either during testing of a DUT having a total of eight data pins or on a DUT having a total of sixteen data pins. Therefore, when an electrical test is performed on a DUT having eight pins after testing a DUT having sixteen data pins, or when testing the DUT having sixteen data pins before testing the DUT having eight data pins, the socket board does not need to be changed.

This is an improvement over the conventional art in which the socket board would need to be changed between tests and the new socket board would have to be re-calibrated to properly compensate for the propagation delays of the new socket board. The time required for replacing a socket board and the time required for re-calibrating the propagation delay of the socket board might be as large as about 3% of the whole operation time of the tester. Thus, according to various principles of the present invention, a significant increase in the operation efficiency of the tester is available.

In addition, if the number of data pins of the DUT were to double, the throughput capacity of the conventional test system would be reduced by half. Thus, a more expensive tester might need to be purchased in order to make up for the lost throughput. According to exemplary embodiments of the present invention, however, the throughput capacity can be maintained by modifying the socket board used in the electrical test process. Thus, the potential cost of manufacturing semiconductor devices can be reduced relative to what might otherwise be required.

Additionally, since the exemplary embodiments of the present invention may allow one kind of socket board to be used for two kinds of DUTs, it can be more easily maintained and a higher reliability may be achieved in the electrical test process, relative to what might otherwise be available.

The invention has been described with reference to various exemplary embodiments thereof. The scope of the present invention must not be interpreted, however, as being restricted to these exemplary embodiments. Rather, it will be apparent to those of ordinary skill in the art that various modifications may be made to the described embodiments without departing from the spirit and scope of the invention.

What is claimed is:

1. A method of testing a semiconductor device comprising:

electrically short-circuiting input/output signal lines of a socket board to electrically connect at least two data pins to an input/output signal channel in the socket board;

starting an electrical test of a semiconductor device in a tester using the socket board; and sequentially reading signals output from the semiconductor device via the short-circuited input/output signal lines by carrying out a byte operation function.

2. The electrical test method of claim 1, further comprising using a dynamic random access memory (DRAM)

device as the semiconductor device, said DRAM device being capable of carrying out the byte operation function.

3. The electrical test method of claim 1, wherein the byte operation function comprises activating first an upper and then a lower data input/output mask pin of the semiconductor device.

4. The electrical test method of claim 1, wherein sequentially reading signals comprises asynchronously reading bytes obtained by the byte operation function.

5. The electrical test method of claim 1, wherein electrically short-circuiting input/output signal lines comprises connecting pins of upper byte input/output signal lines to respective pins of lower byte input/output signal lines in a one-to-one relationship.

6. The electrical test method of claim 5, wherein the number of upper byte input/output signal lines and the number of lower byte input/output signal lines are four and four, respectively.

7. The electrical test method of claim 5, wherein the number of upper byte input/output signal lines and the number of lower byte input/output signal lines are eight and eight, respectively.

8. The electrical test method of claim 5, wherein the number of upper byte input/output signal lines and the number of lower byte input/output signal lines are sixteen and sixteen, respectively.

9. The electrical test method of claim 1, further comprising writing data into the semiconductor device before sequentially reading signals output therefrom.

10. The electrical test method of claim 9, wherein if upper byte data is unique from lower byte data, the write operations are performed with respective activations of lower and upper data input/output mask pins.

11. The electrical test method of claim 9, wherein if upper byte data corresponds to lower byte data, the write operations are performed without use of upper and lower data input/output mask pins.

12. The electrical test method of claim 1, wherein sequentially reading signals comprises:

activating a lower byte data input/output mask pin and reading upper byte output signals of the signals output from the semiconductor device; and after activating the lower byte data input/output mask pins, activating an upper byte data input/output mask pin and reading lower byte output signals of the signals output from the semiconductor device.

13. The electrical test method of claim 12, further comprising pausing for a predetermined delay between reading the upper byte output signals and reading the lower byte output signals.

14. The electrical test method of claim 1, wherein sequentially reading signals comprises:

activating an upper byte data input/output mask pin and reading lower byte output signals of the signals output from the semiconductor device; and after activating the upper byte data input/output mask pins, activating a lower byte data input/output mask pin and reading upper byte output signals of the signals output from the semiconductor device.

15. The electrical test method of claim 14, further comprising setting a predetermined delay time before reading the upper and lower byte output signal to allow stable reading of the data in the tester.

* * * * *